(12) United States Patent
Benwadih

(10) Patent No.: US 11,158,780 B2
(45) Date of Patent: Oct. 26, 2021

(54) THERMAL PATTERN SENSOR WITH PYROELECTRIC CAPACITOR

(71) Applicant: COMMISSARIAT À L'ÉNERGIE ATOMIQUE ET AUX ÉNERGIES ALTERNATIVES, Paris (FR)

(72) Inventor: Mohammed Benwadih, Champigny sur Marne (FR)

(73) Assignee: COMMISSARIAT À L'ÉNERGIE ATOMIQUE ET AUX ÉNERGIES ALTERNATIVES, Paris (FR)

(*) Notice: Subject to any disclaimer, the term of this patent is extended or adjusted under 35 U.S.C. 154(b) by 379 days.

(21) Appl. No.: 16/207,846

(22) Filed: Dec. 3, 2018

(65) Prior Publication Data
US 2019/0172994 A1 Jun. 6, 2019

(30) Foreign Application Priority Data
Dec. 4, 2017 (FR) ...................................... 1761599

(51) Int. Cl.
*H01L 37/02* (2006.01)
*G06K 9/00* (2006.01)
(Continued)

(52) U.S. Cl.
CPC .......... *H01L 37/025* (2013.01); *G01J 5/0025* (2013.01); *G01J 5/024* (2013.01);
(Continued)

(58) Field of Classification Search
CPC ......... H01L 37/025; H01L 27/16; G06K 9/00; G06K 9/00006; G06K 9/0002; G01J 5/34;
(Continued)

(56) References Cited

U.S. PATENT DOCUMENTS 4,394,773 A 7/1983 Ruell
4,429,413 A 1/1984 Edwards
(Continued)

FOREIGN PATENT DOCUMENTS

EP 2385486 A1 11/2011
FR 3044409 A1 6/2017
(Continued)

OTHER PUBLICATIONS

K.S. Tan et al.: "Pyroelectricity enhancement of PVDF nanocomposite thin films doped with ZnO Nanoparticles", Smart Materials and Structures, IOP Publishing LTD, Bristol, GB, vol. 23, n°12, Oct. 16, 2014.
(Continued)

*Primary Examiner* — Marcus H Taningco
(74) *Attorney, Agent, or Firm* — Pearne & Gordon LLP

(57) ABSTRACT

Thermal pattern sensor comprising several pixels located on a substrate, each pixel comprising a pyroelectric capacitance, the pyroelectric capacitance comprising, a layer of porous pyroelectric material located between a first electrically conducting electrode and a second electrically conducting electrode, particles made of a first material at least partially filling the pores of the layer of porous pyroelectric material, the first material being electrically insulating and having pyroelectric properties and a layer made of a second material being placed between the layer made of a pyroelectric material and the second electrode, the second material being electrically insulating and having pyroelectric properties.

22 Claims, 4 Drawing Sheets

(51) Int. Cl.
  *H01L 27/16* (2006.01)
  *G01J 5/34* (2006.01)
  *G01J 5/02* (2006.01)
  *G01J 5/00* (2006.01)
  *G01J 5/06* (2006.01)
  *G01J 5/04* (2006.01)

(52) U.S. Cl.
  CPC .............. *G01J 5/046* (2013.01); *G01J 5/061* (2013.01); *G01J 5/34* (2013.01); *G06K 9/00* (2013.01); *G06K 9/00006* (2013.01); *H01L 27/16* (2013.01); *G01J 2005/345* (2013.01)

(58) Field of Classification Search
  CPC .......... G01J 5/024; G01J 5/0025; G01J 5/061; G01J 5/046; G01J 2005/345
  See application file for complete search history.

(56) References Cited

U.S. PATENT DOCUMENTS

| | | | | |
|---|---|---|---|---|
| 5,418,365 | A | * | 5/1995 | Robin ................ H01L 37/02 250/332 |
| 5,929,441 | A | * | 7/1999 | Beratan ................ G01J 5/023 250/332 |
| 6,289,114 | B1 | | 9/2001 | Mainguet |
| 2003/0173519 | A1 | * | 9/2003 | Seifert .................. G01J 5/34 250/338.3 |
| 2011/0280276 | A1 | | 11/2011 | Mainguet et al. |
| 2015/0028444 | A1 | * | 1/2015 | Noda ..................... G01J 5/34 257/466 |
| 2016/0276569 | A1 | | 9/2016 | Aliane |
| 2018/0032781 | A1 | * | 2/2018 | Mainguet ............ H03K 17/941 |
| 2018/0145396 | A1 | | 5/2018 | Benwadih et al. |
| 2018/0155508 | A1 | | 6/2018 | Benwadih et al. |
| 2018/0254185 | A1 | | 9/2018 | Benwadih et al. |

FOREIGN PATENT DOCUMENTS

| | | | |
|---|---|---|---|
| JP | H08-62038 A | 3/1996 | |
| WO | 2016/024503 A1 | 2/2016 | |
| WO | WO-2017093252 A1 * | 6/2017 | .............. G01J 5/024 |

OTHER PUBLICATIONS

A. Navid et al.: "Purified and Porous Poly(vinylidene fluoride-trifluoroethylene) thin films for pyroelectric infrared sensing and energy harvesting", Smart Materials and Structures, IOP Publishing LTD, Bristol, GB, vol. 19, n°5, May 1, 2010.

U.S. Appl. No. 16/207,614; entitled "Capteur De Motif Thermique a Capacite Pyroelectrique Comprenant Une Matrice Sol-Gel Et Des Particules D'Oxyde Metallique", filed Dec. 3, 2018.

Preliminary French Search Report for Application No. 1761599, dated Oct. 11, 2018.

* cited by examiner

THERMAL PATTERN SENSOR WITH PYROELECTRIC CAPACITOR

TECHNICAL DOMAIN AND PRIOR ART

The invention relates to a thermal patterns sensor, making use of the pyroelectric properties of a material, and advantageously forming a fingerprint sensor.

A fingerprint can be detected using "passive" sensors making use of a temperature difference between the finger and the sensor, as disclosed in documents U.S. Pat. Nos. 4,394,773, 4,429,413 and U.S. Pat. No. 6 289 114. The finger is in direct physical contact with the sensor at the ridges of the print. Heat transfer between the skin and the contact surface of the sensor takes place by conduction, which leads to a first variation of the temperature with time. The finger is not in direct physical contact with the sensor at the valleys of the print, therefore the heat transfer takes place through air that is rather a thermal insulator, which leads to a second smaller variation of temperature with time. The difference between these two variations of the temperature with time results in a difference between the signals measured by the pyroelectric capacitors, depending on whether they are under a valley or under a ridge of the print. Therefore the image of the print includes a contrast that depends on this difference.

However, these sensors have the disadvantage that they make a measurement that is only dependent on the difference between the temperature of the finger and the temperature of the sensor. Thus, after just a few seconds, the temperature of the finger and the temperature of the contact surface of the sensor become homogeneous, and it is no longer possible to obtain a satisfactory contrast.

It is also possible that the signal level obtained is zero when temperatures of the finger and the sensor are the same, or that the contrast of the captured images varies, which then causes problems with subsequent treatment of the images obtained (for example a temperature inversion causes an inversion of the image obtained).

Another active type of sensor offers a solution to this problem through the addition of heating elements under the contact surface of the sensor. Such a sensor is described for example in patent application EP 2 385 486 A1. The heating elements dissipate a certain quantity of heat in each pixel of the sensor and the temperature rise of the pixels is measured after a certain time. Therefore the temperature variation obtained is large at the valleys of the print where heat is transferred to the finger through air, and is smaller at the ridges of the print, where heat is transferred to the finger directly by conduction. The result is that the final temperature in the case of a pixel in the presence of a ridge of the fingerprint, where heat is absorbed by the skin, is lower than the case of a pixel in the presence of a valley of the fingerprint. This can improve the contrast of an image acquired using said sensor, and maintain it over time.

The elements described above for fingerprint detection are also applicable for detection of a thermal pattern other than a fingerprint, the element for which the thermal pattern is to be detected being located on the sensor during the measurement.

A thermal patterns sensor comprises heat detection means that may consist of pyroelectric elements, diodes, thermistors or any other element sensitive to temperature to convert a temperature variation into a variation of potential or electrical current.

More particularly, a pyroelectric type sensor comprises a matrix of pyroelectric capacitors placed on a substrate, for example made of glass. Each pyroelectric capacitor comprises a portion made of a pyroelectric material located between a lower electrode and an upper electrode. One electrode is raised to a constant potential, and forms a reference electrode. The other electrode collects pyroelectric charges, generated by the pyroelectric material in response to a temperature variation.

The pyroelectric material may for example be a polyvinylidene-trifluoroethylene fluoride (denoted P(VDF-TrFE), a polyvinylidene fluoride (PVDF), a ceramic such as PZT (lead zirconate titanate), AlN, $BaTiO_3$ or ZnO. Other pyroelectric materials are possible, namely all materials that produce electric charges as a function of a pyroelectric parameter. The upper electrode is covered with a protection layer on which the element of which the thermal pattern is measured, for example a finger, will be positioned during the measurement.

In the case of an active thermal sensor, the sensor is also provided with a heating element generally made from the same electrically conducting layer as that used to make the upper electrode. For example, this heating element is made in the form of a coil partially surrounding the upper electrodes and capable of heating the pyroelectric capacitors laterally at the upper electrodes.

Each pyroelectric capacitor forms a transducer that translates a variation of the temperature with time into an electric signal such as a difference in electrical potentials.

When the sensor has to be made with a large surface area or low cost, the sensor is advantageously made using a "printing" or "deposition by printing" technology, which is less expensive than lithography on semiconductor. In this case, the different conducting portions forming elements of sensor pixels can be made with conducting inks that are sufficiently stable so that they do not need very high performance encapsulation. It can be envisaged to manufacture the sensor by printing, for example on simple plastic substrates such as polyethylene terephthalate (PET), polyethylene naphthalate (PEN) or polycarbonate (PC).

In such a sensor manufactured by deposition by printing, the printed pyroelectric material has several defects inherent to printing techniques such as a certain porosity and edge effects generating high leakage currents, between electrodes of capacitors that can prevent correct operation of the sensor. For example, for sensors comprising pyroelectric capacitors formed from Au/PVDF/poly(3,4-ethylenedioxythiophene) (also called PEDOT) or Au/PVDF/Ag type stacks, leakage currents are of the order of 1 µA, which is too high considering that the pyroelectric currents obtained are of the order of nA. Such a leakage current is obtained as a result of high porosities (diameter of the order of 5 µm) formed in PVDF. This leakage current has a strong adverse effect on the PVDE polarisation step that has to be implemented. The PVDF-TrFe or porous PVDF layer can be rendered fragile, or completely damaged (breakdown) during application of the high voltage of about 150V/µm necessary for polarisation.

PRESENTATION OF THE INVENTION

One purpose of this invention is to disclose a thermal pattern sensor that has a structure compatible with the manufacture of a passive or active type sensor, and for which the leakage currents are lower than with prior art.

To achieve this, this invention discloses a thermal pattern sensor comprising several pixels located on a substrate, each pixel comprising a pyroelectric capacitor, the pyroelectric capacitor comprising a layer made of a porous pyroelectric material located between a first electrically conducting electrode and a second electrically conducting electrode,
particles composed of a first material at least partially filling the pores of the layer of porous pyroelectric material, the first material being electrically insulating and having pyroelectric properties.

A layer made of a second material is placed between the layer made of a porous pyroelectric material and the second electrode, the second material being electrically insulating and having pyroelectric properties.

The first material and the second material may be identical or different.

The invention is distinguished fundamentally from prior art in that electrically insulating particles (typically with an electric resistivity of more than or equal to $10^9$ ohm and preferably more than or equal to $10^{10}$ ohm) and having pyroelectric properties (typically having a pyroelectric coefficient of more than 5 $\mu C/m^2 K$) at least partially fill the pores of the porous pyroelectric material, which strongly reduces the leakage current and improves the general polarisation of the device. Integration of these particles into the pyroelectric material at least locally densifies the layer made of a pyroelectric material without changing its pyroelectric properties. The pyroelectric coefficient of the capacitor and the heat transfer between the two electrodes are better than in the case of a capacitor comprising, for example PVDF alone without particles.

Furthermore, the layer made of a second material forms a dielectric layer that improves densification of the layer of pyroelectric material under the second electrode, without modifying its pyroelectric properties. The layer made of a second material may be a layer of particles or a dense non-porous layer. At least partially filling the pores means that the volume of pores is at least partially filled by the particles and/or that at least a part of the total number of pores is filled by the particles. The particles may be located at pore openings and/or penetrate into the volume of the pores. The particles can completely block part of the pores or all the pores.

Advantageously, the first material and/or the second material consist of stoichiometric ZnO, and/or a mixture of $Zn(OH)_2$ and stoichiometric and/or non-stoichiometric ZnO, and/or AlN, and/or a mixture of AlN and $Zn(OH)_2$ and/or stoichiometric and/or non-stoichiometric ZnO.

Stoichiometric ZnO is electrically insulating and has good pyroelectric properties.

Non-stoichiometric ZnO is electrically semiconducting and has good pyroelectric properties. Zinc hydroxide is electrically insulating and does not have pyroelectric properties. The $ZnO/Zn(OH)_2$ mixture has low electrical conductivity and good pyroelectric properties, which can limit leakage currents while assuring continuity of pyroelectric properties between the layer made of a pyroelectric material and the second electrode.

Preferably, non-stoichiometric ZnO will be chosen that is less expensive to produce than stoichiometric ZnO that requires a heat treatment step in a high temperature reactor. Furthermore, stoichiometric ZnO is less stable under ultraviolet radiation and tends to degrade into non-stoichiometric ZnO.

Particles in a mixture of $ZnO/Zn(OH)_2$, means a mixture of ZnO particles and/or $Zn(OH)_2$ particles and/or particles in a mixture of $ZnO/Zn(OH)_2$.

Aluminium nitride AlN is a very good electrical insulator (of the order of $10^{14}$ ohm.cm, in other words a resistance of more than $10^{10}$ ohm) and has good pyroelectric properties. This material also has very good thermal conductivity (of the order of 140-180 $W.m^{-1}K^{-1}$).

Advantageously, the first material and/or the second material are mixtures of AlN and $ZnO/Zn(OH)_2$ containing 50% by mass of AlN. Such a material is easy to produce.

Advantageously, the pyroelectric material is polyvinylidene fluoride, a copolymer of polyvinylidene fluoride, such as polyvinylidene-trifluoroethylene fluoride, a ceramic such as PZT, AlN, $BaTiO_3$ or ZnO. The invention is particularly useful in the case of PVDF that has several defects inherent to printing techniques (porosity and edge effects generating high current leaks) preventing correct operation of the devices.

Advantageously, the surface porosity of the pyroelectric material is equal to more than 15% of the total surface area of the pyroelectric material.

Advantageously, the thickness of the layer of pyroelectric material varies from 20 nm to 5 $\mu m$, and preferably from 2 $\mu m$ to 4 $\mu m$.

Advantageously, the sensor also comprises at least one heating element electrically insulated from the electrically conducting electrodes and located facing at least part of the layer of pyroelectric material such that the layer of pyroelectric material is located between the heating element and the substrate.

Advantageously, the sensor is a fingerprint sensor.

The invention also relates to a method for fabrication of a thermal pattern sensor as defined above, comprising the following steps in sequence:

a) supply a substrate, covered by a first electrode, and a layer of porous pyroelectric material, b) deposit particles composed of a first material so as to at least partially fill the pores of the layer of porous pyroelectric material, c) deposit a layer composed of a second material on the layer made of a porous pyroelectric material, d) form a second electrode, e) possibly, deposit a dielectric layer and form a heating element, f) possibly, deposit a protection layer.

the first material being electrically insulating and having pyroelectric properties, the second material being electrically insulating and having pyroelectric properties.

Preferably, the first material and the second material are identical, which simplifies the production process, the particles and the layer on the pyroelectric layer being made in a single step.

Advantageously, between step b) and step d), and/or possibly between step c) and step d), the method comprises an additional step in which a heat treatment is done at a temperature varying from 120° C. to 180° C. Annealing can completely evaporate residues of solvent and/or form a crystalline pyroelectric material, which improves its pyroelectric properties, particularly in the case of ZnO or $ZnO/Zn(OH)_2$ particles. Advantageously, with AlN particles, the material is auto-organised at the outlet of the deposit and there is no need to perform annealing and/or polarisation steps.

Advantageously, step b) is done by depositing a solution containing stoichiometric ZnO particles, and/or a mixture of $Zn(OH)_2$ and stoichiometric or non-stoichiometric ZnO and a solvent preferably chosen from among butyl acetate, propyl acetate, isopropanol, ethanol, methanol, methoxyethanol, ethoxyethanol, hexane and cyclohexane.

Advantageously, the solution containing the particles is deposited by spin coating or by screen printing. A screen printed deposit can deposit particles locally.

Advantageously, the solution contains 5 mg/mL to 100 mg/mL, and preferably 10 mg/mL to 50 mg/mL of particles.

Advantageously, the particles are obtained by performing the following steps in sequence:
preparation and mixing of a solution comprising zinc acetate, KOH and a solvent in which ZnO and/or ZnO/Zn(OH)$_2$ are insoluble,
heating of the solution to the solvent boiling temperature, under reflux, zinc acetate and KOH reacting to form ZnO and/or ZnO/Zn(OH)$_2$,
decantation of the solution obtained in the previous step, preferably, add a surfactant to disperse the particles.

Advantageously, the layer of porous pyroelectric material is deposited using a printing technique such as screen printing.

BRIEF DESCRIPTION OF THE DRAWINGS

This invention will be better understood after reading the description of example embodiments given purely for information and that are in no way limitative with reference to the appended drawings on which.

The different parts shown on the figures are not necessarily all at the same scale, to make the figures more easily understandable.

The different possibilities (variants and embodiments) must be understood as not being mutually exclusive and can be combined with each other.

DETAILED PRESENTATION OF PARTICULAR EMBODIMENTS

Figure 1:
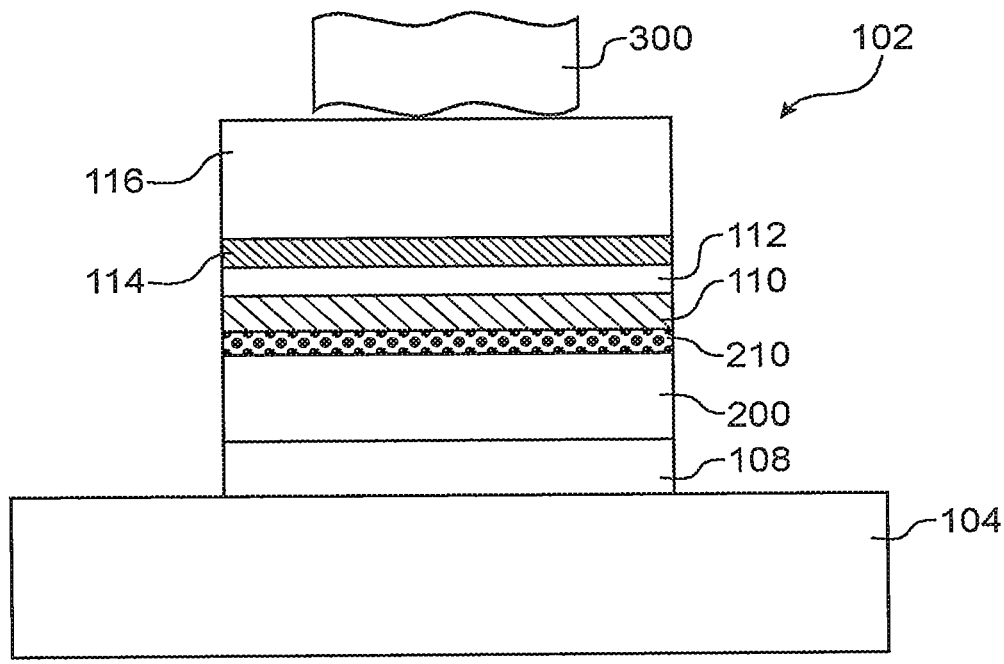
FIG. 1 diagrammatically shows a sectional view of a pixel of a thermal pattern sensor, according to a first particular embodiment of the invention, FIG. 2 diagrammatically shows a sectional view of a pixel of a thermal pattern sensor, according to a second particular embodiment of the invention.
Figure 2:
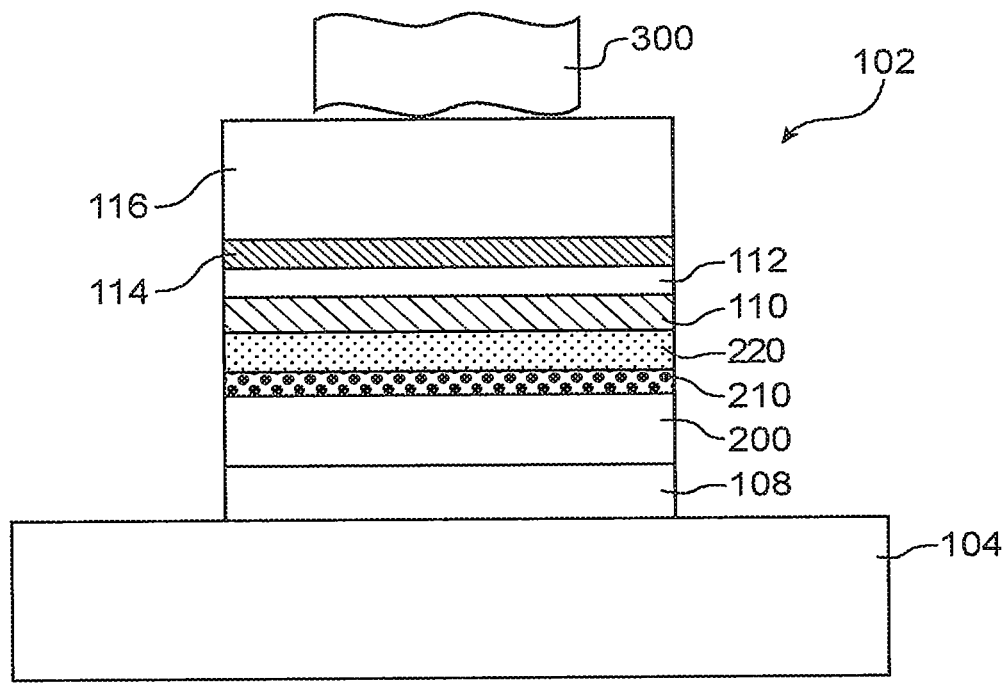

Refer firstly to FIGS. 1 and 2 that represent sectional views of a part of a pixel 102 of a thermal pattern sensor, according to different embodiments.

The Substrate 104:

The pixel 102 is made on a substrate 104 for example made of glass or a semiconducting material (for example silicon).

The substrate 104 can also be a flexible substrate, for example based on polyimide, PEN (polyethylene naphthalate), PET (polyethylene terephthalate), or polycarbonate (PC), on which electronic elements of the sensor, such as "Thin Film Transistors" (TFT transistors), are made using the printed electronics technology (for example manufacturing using inkjet, screen printing, offset printing and photogravure type write heads) or by lithography.

The Pixels 102:

A single pixel is represented on the substrate 104 represented on FIG. 1 to make the figure more easily understandable, but the substrate of a thermal pattern sensor comprises a plurality of pixels 102. The pixels 102 of the sensor are made by forming a matrix composed of several rows and several columns of pixels 102. The pitch of the pixels 102 in the plane of the substrate 104 may for example be between about 50 μm and 100 μm. In the case of a sensor with resolution equal to 500 dpi ("dots per inch"), the pitch of the pixels 102 is equal to 50.8 μm.

Each pixel 102 of the sensor comprises thermal measurement or detection means formed by a pyroelectric capacitor. Each pyroelectric capacitor comprises in sequence, starting from the substrate 104, a lower electrode 108, a pyroelectric material 200 and an upper electrode 110. The capacitor is described herein and in the following as being a vertical capacitor, but it could equally well be a horizontal capacitor.

The Pyroelectric Material 200:

The layer of pyroelectric material 200 is a porous layer. The layer comprises a first principal face in contact with the first electrode. In contact means that these elements are adjacent. The second principal face is facing the second electrode.

The pyroelectric material may for example be polyvinylidene fluoride or a copolymer of polyvinylidene fluoride, such as polyvinylidene-trifluoroethylene fluoride P(VDF-TrFe). Different compositions of TrFe in P(VDF-TrFe) can be envisaged, so as to obtain high values of the pyroelectric coefficient. These compositions may correspond to a mole percentage varying from 10% to 50% for TrFe and varying from 90% to 50% for PVDF. Preferably, the mole percentage is about 20% for TrFe and about 80% for PVDF, which can give better crystallisation characteristics of the pyroelectric material. For example, the dielectric permittivity of PVDF is of the order of 10.

A person skilled in the art will be able to choose any porous pyroelectric material that creates electrical charges as a function of a pyroelectric parameter.

The thickness of the layer of pyroelectric material 200 will for example be between 20 nm and 5 μm, and preferably between 1 μm and 5 μm. For example, it may be 2 μm. Preferably, it varies from 100 nm to 3 μm, more preferably from 100 nm to 2 μm, and for example is equal to 1 μm. The thickness of deposited pyroelectric material 200 is controlled because this thickness is the thickness of the pyroelectric capacitor (distance between the electrodes) and is directly involved in the calculation of the useful pyroelectric capacitance C.

The pore size of the pyroelectric material will for example be between 1 μm and 10 μm, and preferably between 2 μm and 10 μm. For example, a pore size of the order of 5 μm will be chosen.

The pores in the layer of pyroelectric material are at least partially filled by particles 210 made of a first electrically insulating material and with properties, so as to limit leakage currents. The particles 210 can be located at the openings in the pores located on the second face of the layer made of a porous pyroelectric material. They may partially or completely close off the openings in the pores. They may also be located in the volume of the pores. They may for example be located in the first third or in the first half of the thickness of the layer made of a porous pyroelectric material starting from the second principal face of said layer. The second principal face may be in contact with the second electrode.

Particles refers to elements with nanometric or micrometric dimensions and a spherical, cylindrical or ovoid shape.

For example, the largest dimension of the particles varies from 20 nm to 1 µm, and preferably from 20 nm to 100 nm.

The particles 210 may be partially or completely covered by a layer of organic residues originating from the synthesis of said particles.

Preferably, a layer 220 made of a second material, identical to or different from the first material, also covers the layer of pyroelectric material. The layer 220 made of a second material is in contact with the second electrode.

The layer 220 may be a layer of particles, in contact with each other, or a dense solid (non-particulate) layer.

The thickness of the layer 220 varies between 10 nm and 500 nm, for example between 10 nm and 300 nm, and preferably between 50 nm and 500 nm.

Preferably, the first material and/or the second material consist of stoichiometric ZnO, and/or a mixture of $Zn(OH)_2$ and stoichiometric or non-stoichiometric ZnO, and/or AlN, and/or a mixture of AlN and $Zn(OH)_2$ and/or stoichiometric and/or non-stoichiometric ZnO.

The resistance of such materials is more than $10^9$ ohm.cm, preferably more than $10^{10}$ ohm.cm, and even more preferably more than $10^{14}$ ohm.cm. This prevents leakage currents between the two electrodes.

Figure 3:
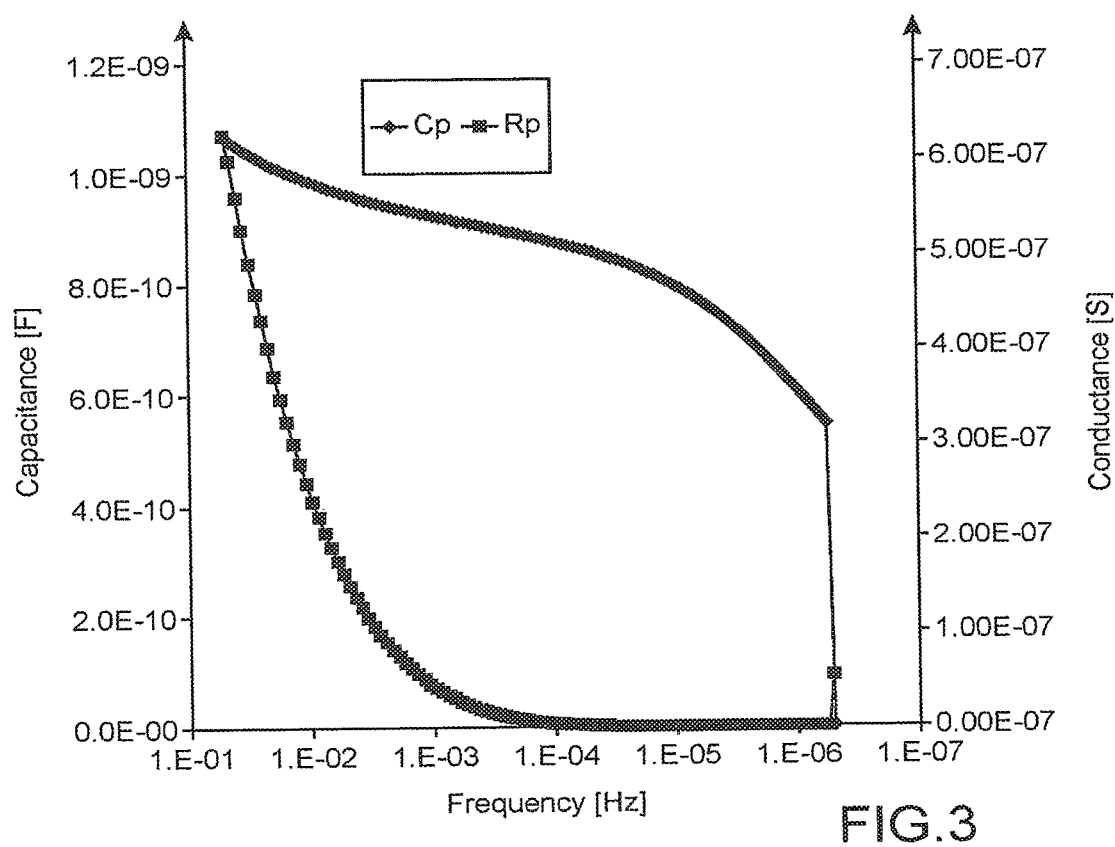
FIG. 3 is a graph showing the capacitance and conductance as a function of the frequency, of a pyroelectric material covered by a ZnO/Zn(OH)$_2$, layer

As represented on FIG. 3, the presence of a 100 nm thick layer 220 composed of $ZnO/Zn(OH)_2$ on a pyroelectric layer composed of PVDF for which the pores are partially filled by particles 210 composed of $ZnO/Zn(OH)_2$ does not modify the capacitance. A value of about inF is measured for a surface area of 30 $mm^2$.

Figure 4:
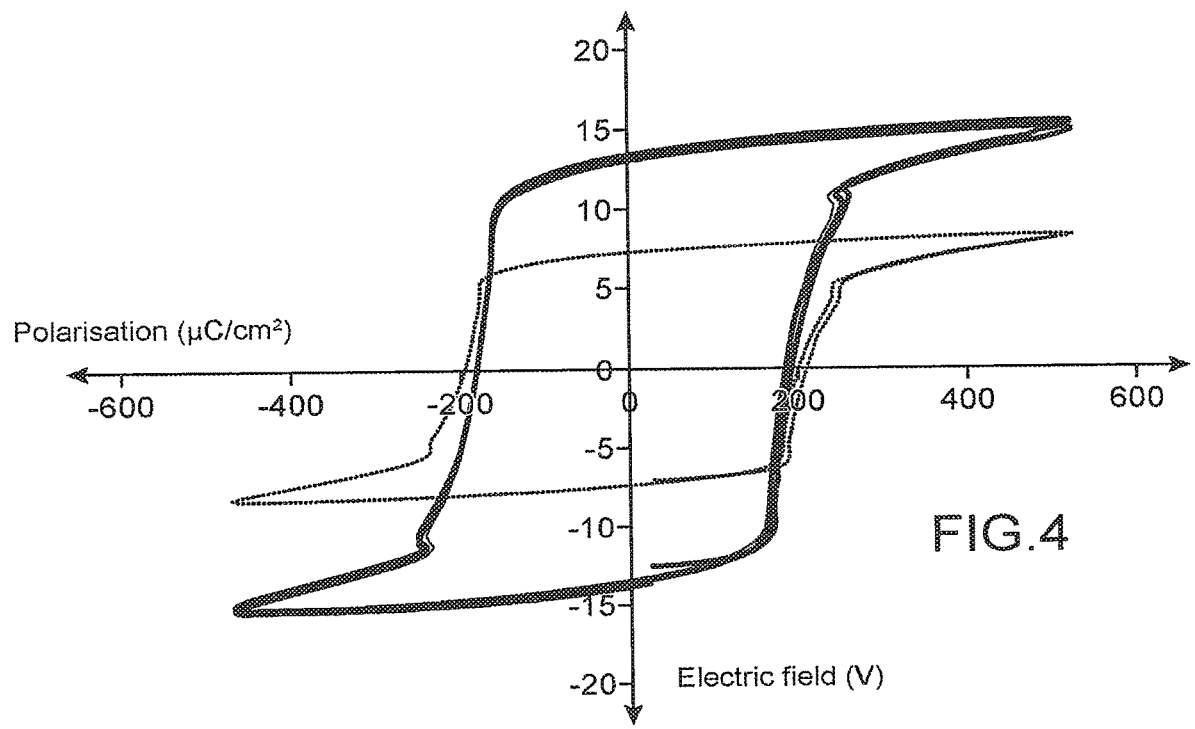
FIG. 4 is a graph representing the hysteresis cycle of the capacitor, for a pyroelectric material alone and for a pyroelectric material covered by different thicknesses of ZnO/Zn(OH)$_2$ layers.

The electrical characteristics of pyroelectric layers with and without a $ZnO/Zn(OH)_2$ layer/particles were compared (FIG. 4). After having polarised the PVDF, it can be seen that the pyroelectric properties are improved due to the presence of the $ZnO/Zn(OH)_2$ layer and particle. The hysteresis cycle does not change regardless of the thickness of the $ZnO/Zn(OH)_2$ layer (between 100 and 500 nm).

The Electrodes 108, 110:

Each of the lower electrode first electrode) 108 and the upper electrode (or second electrode) 110 comprises at least one electrically conducting material. Each of the electrodes 108, 110 can comprise at least one of the following materials: Ti, Pt, Ni, Au, Al, Mo, Ag, MoCr, AlSi, AlCu. One of the electrodes 108, 110, advantageously the upper electrode 110, or each of the two electrodes 108, 110, can be formed from a stack of several electrically conducting materials, for example a Ti/TiN, Ti/TiN/AlCu, or Ti/Au stack.

The thickness of the each of the electrodes 108, 110 may for example be between about 0.01 µm and 1 µm. The thickness of each of the electrodes 108, 110 can be higher, for example up to about 5 µm, particularly when these electrodes are made by printing using materials such as silver, copper, carbon or PEDOT (poly(3,4-ethylenedioxythiophene). A layer of gold deposited by photolithography may for example be 50 nm thick.

As a non-limitative illustration, the upper electrode 110 and/or the lower electrode 108 is a layer with a thickness equal to about 0.2 µm, composed of titanium and/or molybdenum and/or aluminium and/or a conducting oxide such as ITO (indium tin oxide) and/or a conducting polymer.

As a non-limitative illustration, the upper electrode 110 and/or the lower electrode 108 is formed from one or several Ti/TiN type stacks with a Ti thickness between about 50 nm and 500 nm and a TiN thickness between about 10 nm and 500 nm. It would also be possible to use a Ti/Au stack with a Ti thickness equal to 5 nm and an Au thickness equal to 50 nm, or a 50 nm gold layer, or also a 50 nm thick MoCr alloy. For example, a lower electrode made of Ti/Au, for example deposited by photolithography can be combined with a 1 µm thick upper electrode made of PEDOT-PSS.

The upper electrode 110 and/or the lower electrode 108 is (are), for example, in the form of metal lines parallel to each other. For example, such lines can be made of gold. The lower electrode 108 may also be made of gold, and the upper electrode 110 may be made of PEDOT-PPS, and may for example be 1 µm thick.

The Dielectric Layer 112:

The upper electrode 110 is covered by a dielectric layer 112. The thickness of the dielectric layer varies for example from 0.1 µm to 5 µm. For example, the dielectric layer may be composed of polyimide. It electrically isolates the upper electrode 110 from the heating elements 114.

The Heating Elements 114:

In the embodiment in which the sensor is capable of active thermal detection, in addition to the previously described elements, the sensor also includes heating elements 108 dissipating a certain quantity of heat in the pixels 102, and particularly in the pyroelectric material 200. For example, these heating elements 108 are formed by electrically conducting portions originating from the same layer as that used to make the upper electrodes 110 or the lower electrodes 108. The material(s) used to make the heating element 114 can be chosen from among the following materials: Ti, Pt, Ni, Au, Al, Ag, AlSi, AlCu. For example, the heating elements 114 are made by a deposition of metallic ink, for example comprising silver, deposited by printing. The heating elements 114 are, for example, in the form of metal lines parallel to each other. As represented on FIG. 5, the lines forming the heating elements may be perpendicular to the lines of the lower electrode 108.

The heating element 114 may comprise a Ti layer with a thickness of about 30 nm to 100 nm and another electrically conducting layer made of AlSi or AlCu and with a thickness between 100 nm and 700 nm. In such a configuration, the AlSi or AlCu layer protects the titanium or TiAu layer against oxidation.

For example, the thickness of the heating elements 114 is between 0.5 µm and 10 µm, and preferably between 1 µm and 5 µm.

Each of the heating elements 114 forms a resistive metallic element (for example electrical resistance between about 10Ω and 100Ω) associated with a pixel 102 and that can be used to heat this pixel 102 independently of the heating elements 114 associated with the other pixels 102. When the device makes a detection, the heating elements 114 can be used to dissipate a certain quantity of heat in the pixels 102, and particularly in the pyroelectric material of the layer 113. In each pixel 102, the portion 200 of pyroelectric material is heated by circulating a current in the heating element 114 forming the heating resistance of each of the pixels 102.

The pyroelectric material 200 is heated by circulating a current in the heating element 114 forming the heating resistance of each of the pixels 102. In order to achieve good detection sensitivity, translating a large temperature difference between a pixel in contact with a ridge of the fingerprint and a pixel in contact with a valley of the fingerprint, electrical powers injected into the heating element can vary from 0.5 mW/pixel to 5 mW/pixel in the case of pixels with sides with dimensions equal to about 50 µm (as is the case for a standard fingerprint sensor with resolution equal to 500 dpi).

The Protection Layer 116:

The heating elements 114 and the parts of the dielectric layer 112 on which the heating elements 114 are not present are advantageously covered by a protection layer 116 for example corresponding to a laminated layer of PET or any other material adapted to fabrication of this layer. Other materials can also be envisaged for this layer 116, for example such as polyimide, PVDF and/or its copolymers, PMMA, etc. The material(s) used and the thickness of the layer are chosen to achieve good heat transfer from the front face 116 to the pyroelectric capacitor. Thus, the protection layer 116 is made such that its thermal resistance is not too high (because heat would not pass through it), and that its thermal conductance is not too high (because in this case heat would escape through the sides to other pixels causing diathermy within the sensor), and is not too thick (to obtain heat transfer passing from the front face of the protection layer 116 towards the pyroelectric capacitor) or too thin (nevertheless the thickness of the layer 116 must be sufficient so that its protection role is satisfied). The thickness of the protection layer 116 may vary from a few microns (for example 5 µm) to about 100 µm. The thickness may for example be of the order of 10 µm. Alternatively, the protection layer 116 may correspond to a Diamond Like Carbon (DLC) layer with a thickness of less than about 1 µm.

The top face of the protection layer 116 corresponds to the surface on which there is the thermal pattern to be detected, for example a finger for which the fingerprint is to be detected. The part of a finger 300 with the valleys and the ridges of the fingerprint are shown in FIG. 1.

Method of Fabrication and Deposition of ZnO or ZnO/Zn(OH)$_2$ Particles

Particles 210 are synthesised by performing the following steps in sequence:

i. preparation of a first solution comprising zinc acetate and a first solvent in which the ZnO and/or ZnO/Zn(OH)$_2$ is insoluble and heating of the solution to the boiling point of the first solvent, under reflux, ii. preparation of a second solution containing KOH in a second solvent, miscible with the first solvent, and in which the ZnO and/or ZnO/Zn(OH)$_2$ is insoluble and heating of the solution to the boiling point of the second solvent, under reflux, iii. mix the first solution with the second solution, zinc acetate and KOH reacting to form ZnO and/or ZnO/Zn(OH)$_2$ insoluble in methanol, and keep heating to the boiling point of the solvent with the highest boiling point, for several hours under reflux, iv. decantation of the solution obtained in the previous step, v. addition of a surfactant.

Preferably, the first solvent and the second solvent are compatible with the pyroelectric layer, particularly in the case of a PVDF pyroelectric layer or a PVDF copolymer. Preferably, the first solvent and the solvent will be chosen, independently of each other among butyl acetate, propyl acetate, isopropanol, ethanol, methanol, methoxyethanol, ethoxyethanol, hexane and cyclohexane.

Preferably, the first and the second solvents are identical. Even more preferably, it is methanol.

Step iii can be done for between 1 h and 10 h, for example 3 h.

Settlement in step iv can be done for several hours, for example for a duration equal to between 2 h and 10 h, for example 4 h.

The float may be removed and replaced by an identical or different volume of solvent or solvent mixture, between steps iv and v. For example, 50 mL of solvent or solvent mixture can be added.

The role of the surfactant is to disperse the particles 210 so as to make the solution homogeneous and transparent. A homogeneous solution will make it easier to obtain a homogeneous deposit. Between 1% and 10% molar, for example 5% molar of surfactant can be added to the quantity of particles 210.

The surfactant is preferably chosen from among methoxy ethoxy acetic acid (MEA), methoxybenzoic acid, (ethylthio)benzoic acid, dimethoxybenzoic acid, decanoic acid, nitrobenzoic acid, trifluoromethylbenzoic acid, or a mixture of them.

For illustrative and non-limitative purposes, the ZnO and/or ZnO/Zn(OH)$_2$ particles 210 are obtained by:

mixing 1.5 grams of zinc acetate and about 60 ml of methanol in a twin-neck flask, mixing about 0.75 grams of potassium hydroxide and 30 ml of methanol in a single-neck flask.

heating the two flasks for about ten minutes to 60° C. (boiling point of methanol), mixing the content of the first flask with the content of the second flask, for 3 h under reflux, allowing the solution obtained in the previous step to decant for 4 h, removing the float, replacing it by 50 mL of methanol, then allowing it to decant for one night, adding 5% molar of methoxy ethoxy acetic acid relative to the molar quantity of particles.

The solution is then deposited by any adapted printing technique using liquid inks (screen printing, photogravure, inkjet, flexoprint, offset printing) or coating. For example, the solution is deposited by spin-coating.

Figure 5:
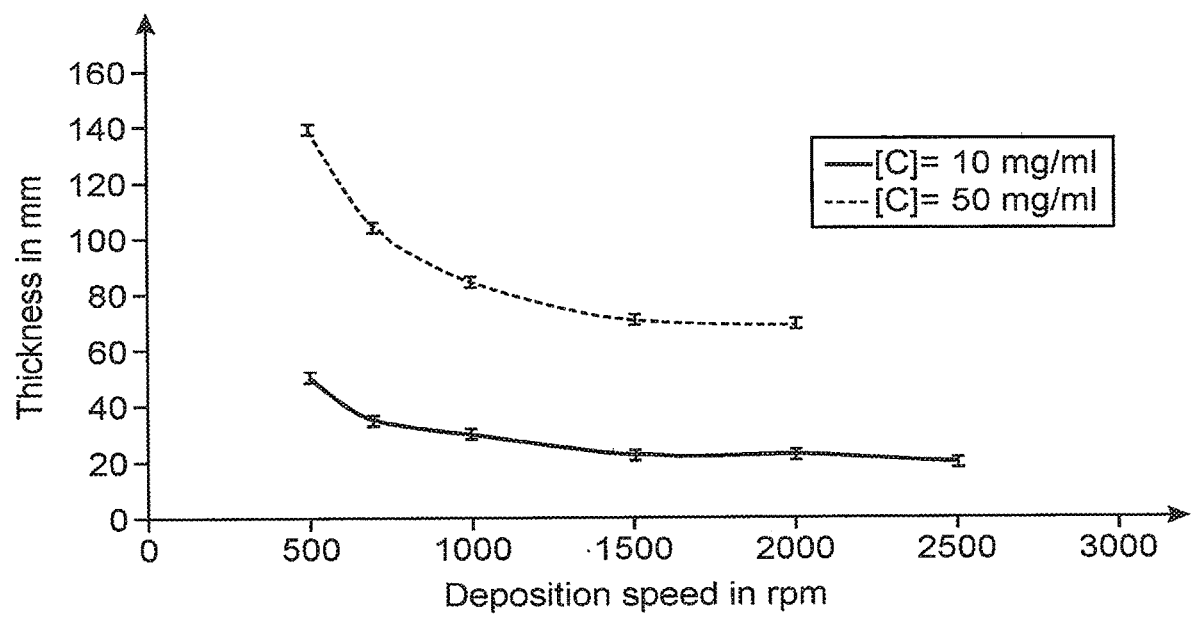
FIG. 5 is a graph representing the thicknesses of the ZnO/Zn(OH)$_2$ layers obtained by depositing the solution containing ZnO/Zn(OH)$_2$ particles, by spin coating, as a function of the concentration by mass of particles and the deposition rate.

FIG. 5 shows the thickness of the particles layer 220 as a function of the concentration by mass of particles in solution and as a function of the deposition rate.

For example, to obtain a thickness of 35 nm, a deposition rate of about 1000 rpm/min and a particle concentration of 10 mg/mL will be used.

Advantageously, a heat treatment is applied after the particles have been deposited. Annealing is done in situ on subjacent layers of the thermal patterns sensor.

Heat treatment is done at a temperature, preferably equal to between 120° C. and 180° C., for example at a temperature of 150° C. Such temperatures can advantageously be used for annealing on plastic substrates.

The annealing step partially or completely eliminates organic compounds originating from synthesis (for example additives and/or solvent), that can influence the pyroelectric properties and/or the permittivity of the layer. When the organic compounds are not completely eliminated, the particles are covered locally or partially by a layer of organic residues.

Figure 6:
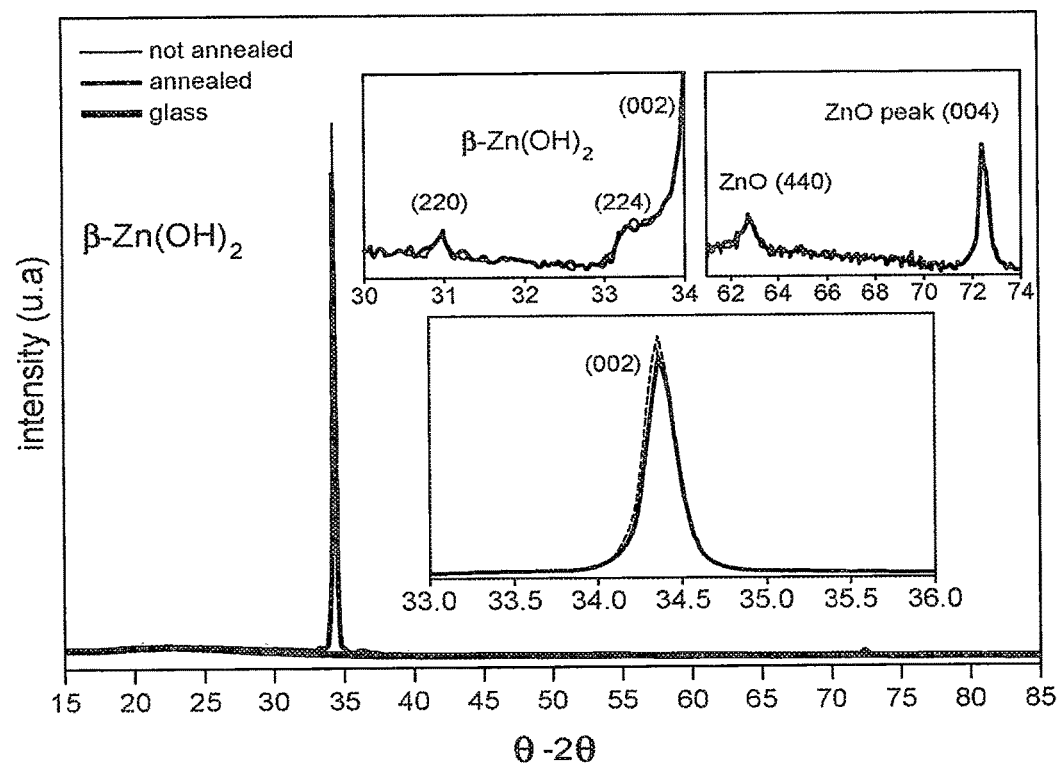
FIG. 6 represents several X-ray diffraction patterns for a ZnO/Zn(OH)$_2$ layer before and after annealing at 150° C., for 15 minutes.

The annealing step can also form crystalline ZnO. After annealing, the material contains crystalline ZnO , and hydroxide Zn(OH)$_2$ (FIG. 6).

Figure 7A:
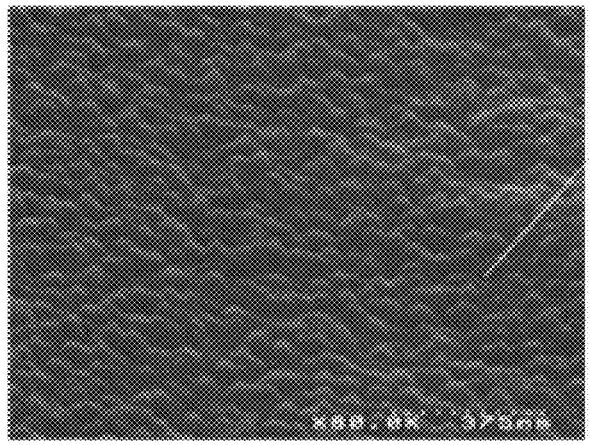
FIGS. 7A to 7C represent images obtained by scanning electron microscopy, of a ZnO/Zn(OH)$_2$ layer before (FIGS. 7A and 7B) and after (FIG. 7C) annealing at 150° C., for 15 minutes.
Figure 7B:
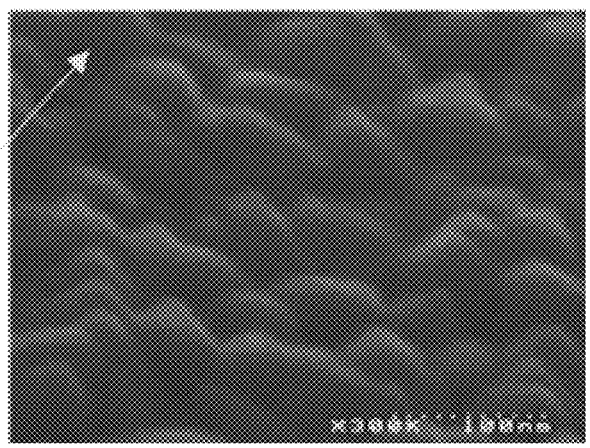
Figure 7C:
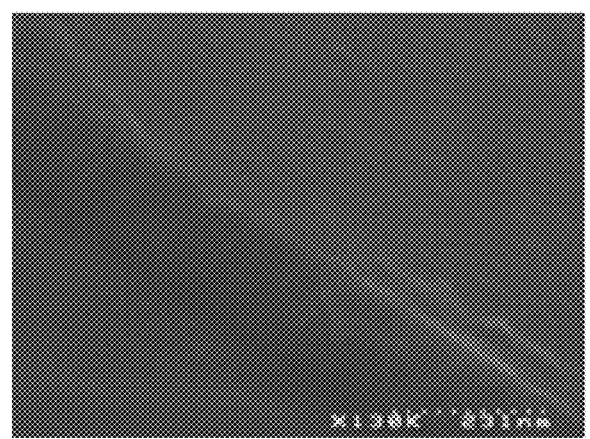

As shown on FIGS. 7A and 7B, a compact arrangement of ZnO particles can be seen before the annealing step. A reduction in the roughness and the grain size of the ZnO layer is observed after heat treatment at 150° C. for 15 minutes. The ZnO layer 220 is densified. The result obtained after annealing is a ZnO layer 220 with a thermal conductivity of ZnO=6 W.m$^{-1}$K$^{-1}$ and a pyroelectric coefficient of 20-30 μC/m$^2$K (for comparison, the pyroelectric coefficient of PVDF is 25 μC/m$^2$K). The thermal conductivity is approximately identical (in this case the same order of magnitude) after densification. Densification can be quantified for example by X rays by making a reflectivity measurement.

Annealing can be done for a duration of between a few minutes (for example 5 minutes) and a few hours (for example 2 hours). For example, annealing can be done at 150° C. for 15 minutes.

Annealing can be done in a furnace.

It can also be done by absorption of intense light (laser, xenon flash, infrared or photonic), which improves demixing of the different oxides.

Method of Fabrication of the Thermal Pattern Sensor:

A method of fabricating a thermal pattern sensor comprising such pyroelectric capacitors will now be described.

The sensor is made from substrate 104. The material of the substrate 104 (glass, semiconductor, plastic, etc.) is chosen depending on the technology used to make the different electronic elements of the sensor. The substrate 104 is firstly cleaned so as to eliminate organic residues present on the substrate. The type of cleaning used will depend on the material of the substrate 104.

The second step consists of depositing a first electrically conducting layer, for example a metallic layer, on the front face of the substrate 104, from which the electrode 108 will be made. The layer may be deposited in the PVD vapour phase, by sputtering, screen printing, spray, or even by inkjet, depending on the materials and thicknesses to be deposited. When the layer is formed by a PVD deposit, the thickness of the layer will for example be equal to about 100 nm to 2 μm. In general, the thickness of the layer is greater than or equal to about 100 nm. Other types of deposit can be used to make a layer with a thickness of more than about 2 μm. The structure of the electrodes 108 can be defined by using a photolithography and etching step of the layer.

The pyroelectric material layer 200 is then formed on the first electrode 108. The PVDF pyroelectric material or one of its copolymers may be deposited by spin coating. Other types of local deposits can be used such as screen printing or spraying or even deposition by inkjet.

An irradiation step of the pyroelectric material can then be used to crystallise at least the second face of the pyroelectric material layer, to improve pyroelectric performances. This irradiation is implemented for example by a UV light flash with a flash or pulse duration between about 500 μs and 2 ms, a fluence (energy output per unit area) equal to between about 15 J/cm$^2$ and 25 J/cm$^2$, and with light wavelength between about 200 nm and 380 nm. The number of flashes or pulses of UV light during this irradiation varies as a function of the thickness on which the pyroelectric material must be crystallised. For example, for a thickness of P(VDF-TrFe) equal to about 2 μm, irradiation can be applied with a fluence equal to about 17 J/cm$^2$, a pulse duration equal to about 2 ms and a number of pulses equal to 5.

The pyroelectric material on which a previous crystallisation may have been carried out is then annealed, for example at about 130° C. for about 60 min, to finalise total crystallisation of the pyroelectric material.

The pyroelectric material can therefore be crystallised in two steps: firstly irradiation by a UV light pulse to crystallise the second face of the layer of pyroelectric material so as to increase its thermal conductivity, then thermal annealing to complete crystallisation for the remainder of the pyroelectric material not crystallised by the previous irradiation.

When the pyroelectric material is a copolymer based on P(VDF-TrFe), an initial polarisation step of the pyroelectric material has to be implemented before the first time that the sensor is used to detect a thermal pattern, by applying a direct electrical voltage at its terminals, through the electrodes 108, 110, so as to improve the pyroelectric coefficient of this material. This polarisation is done once only for the life of the pyroelectric material. This polarisation by direct current can be made at ambient temperature or heat accelerating (up to about 100° C.). When polarisation is done at ambient temperature, a direct voltage can be applied equal to about 150V/μm of thickness of the pyroelectric layer for a duration for example equal to between a few seconds and a few minutes. For example, a voltage of 120V/μm will be applied during 20 s. When polarisation is done hot, for example at a temperature of about 90° C., a direct voltage equal for example to between about 50 V and 80 V per micron of thickness of the pyroelectric layer can be applied for a duration equal for example to between about 1 minute and 5 minutes. The temperature is then reduced to reach ambient temperature and the electrical field applied on the pyroelectric material through the applied direct voltage is cut off. With such polarisations, pyroelectric coefficients of PVDF equal to between about 20 and 45 μC/(m$^2$.K) can be obtained.

Molecules inside the pyroelectric layer 200 remain oriented in this way, even when this electric field is no longer applied to the material. The material can thus be polarised by applying an initial polarisation voltage to the terminals of the electrodes 108, 110. Preferably, a thickness of pyroelectric material equal to or less than about 2 μm will be chosen to improve polarisation of the pyroelectric material of this capacitor, and the electric voltage level applied between the electrodes 108, 110 to make the initial polarisation of the pyroelectric material (when the pyroelectric material has to be initially polarised).

Particles 210 of ZnO and/or ZnO/Zn(OH)$_2$ are then deposited on the pyroelectric material layer 200, so as to partially or completely fill in the pores of the second principal face of said pyroelectric layer 200, and possibly also to form a ZnO layer 220 on said pyroelectric layer 200.

As described above, the ZnO and/or ZnO/Zn(OH)$_2$ particles 210 can be deposited by any printing technique making use of liquid inks (screen printing, photogravure, inkjet, flexoprint, offset printing).

When the layer made of a pyroelectric material 200 is covered by a complete ZnO layer 220, this layer can be deposited by a vacuum technology such as Atomic Layer Deposition (ALD), Physical Vapour Deposition (PVD) or sputtering.

Portions of the pyroelectric material 200 are defined by the use of photolithography and etching of the pyroelectric material. When the etching used corresponds to plasma etching, an O$_2$ plasma can be used alone or in combination with SF$_6$ (sulphur hexafluoride). Portions of pyroelectric material kept after application of this etching correspond to portions of the pyroelectric material located at the pixels 102 of the sensor.

As a variant, the portions can be made directly without an etching step, by localised deposition for example corresponding to a deposition by ultrasound spray, or by inkjet or by screen printing.

The second electrode or the upper electrode 110 is then deposited using deposition techniques that may be identical to or different from techniques used to deposit the first electrode.

One or several second electrically conducting layers intended to form the heating elements 118 are then deposited on the structure obtained at this stage of the process. The heating element 118 is then formed by etching the electrically conducting layer(s) previously deposited using the pattern of the heating element 118, for example in the form of a coil or in the form of a rectangular line. For example, a photolithography step followed by a plasma etching or wet etching step, are used to form the heating element 118. The layer is etched, for example through the use of plasma etching.

The material(s) that will be used to form the protection layer 116 is or are then deposited on the entire previously fabricated structure. Depending on the deposited material(s), the deposit(s) may for example be made by physical deposition (for example PVD) at low temperature, or by a wet method (for example by centrifuging, spraying or inkjet). When this or these protection materials are deposited locally, for example by spraying or by inkjet, the protection layer 116 is formed as soon as the deposit is made locally on the heating element 118 and on any parts of the pyroelectric material not covered by the heating element 118 (as is the case when the heating element 118 forms a coil located only above the portions 200), and there is no need to use etching of the deposited material(s) to form the layer 116.

Otherwise, the material(s) is (are) also deposited at the side of the portions of pyroelectric material, etching (for example plasma etching) is then applied to eliminate the parts of the material(s) deposited at the side of the portions, to thus enable access to the ends.

In the different examples described above, the sensor is used as a fingerprint detector. However, the sensor can be used to detect thermal patterns other than fingerprints, because each pixel 102 of the sensor reads the calorific capacitor placed above it regardless of the nature of the thermal pattern.

For example, the sensor can also be used to make an uncooled infrared imager. In this case the pixels 102 of the sensor are integrated into a CCD or CMOS type integrated circuit collecting electrical charges generated by the sensor. Such an imager also comprises an infrared lens filtering light arriving at the sensor. The imager comprises a device that successively blocks infrared light arriving at the sensor and then allows this light to pass, so that a temperature difference can be applied to the. sensor (necessary considering the measurement made by the pyroelectric capacitors). Such a device may correspond to a "chopper", in other words a wheel in which a hole is formed rotating in front of the sensor. An absorber element may be added on the pyroelectric material to improve absorption of the received infrared radiation.

What is claimed is:

1. Thermal pattern sensor comprising several pixels located on a substrate, each pixel comprising a pyroelectric capacitor, the pyroelectric capacitor comprising a layer made of a porous pyroelectric material located between a first electrically conducting electrode and a second electrically conducting electrode, the layer made of the porous pyroelectric material having a first principle face and a second principle face, wherein particles made of a first material having a largest dimension of from 20 nm to 1 μm at least partially fill the pores of the layer of porous pyroelectric material, the first material being electrically insulating and having pyroelectric properties, and wherein a layer made of a second material is placed between the layer made of a porous pyroelectric material and the second electrode, the second material being electrically insulating and having pyroelectric properties.

2. Sensor according to claim 1, wherein the first material and the second material are made of stoichiometric ZnO.

3. Sensor according to claim 1, wherein the first material and the second material are made of a mixture of $Zn(OH)_2$ and stoichiometric ZnO.

4. Sensor according to claim 1, wherein the first material and the second material are made of a mixture of $Zn(OH)_2$ and non-stoichiometric ZnO.

5. Sensor according to claim 1, wherein the first material and the second material are made of a mixture of $Zn(OH)_2$ and stoichiometric and non-stoichiometric ZnO.

6. Sensor according to claim 1, wherein the first material and the second material are made of AlN.

7. Sensor according to claim 1, wherein the first material and the second material are made of a mixture of AlN, $Zn(OH)_2$ and stoichiometric ZnO.

8. Sensor according to claim 1, wherein the first material and the second material are made of a mixture AlN, $Zn(OH)_2$ and non-stoichiometric ZnO.

9. Sensor according to claim 1, wherein the first material and the second material are made of a mixture of AlN, $Zn(OH)_2$ and stoichiometric and non-stoichiometric ZnO.

10. Sensor according to claim 9, wherein the first material and the second material are made of a mixture of AlN and $ZnO/Zn(OH)_2$ comprising 50% by mass of AlN.

11. Sensor according to claim 1, wherein the thickness of the layer of second material varies between 10nm and 500nm.

12. Sensor according to claim 1, wherein the pyroelectric material is chosen from among polyvinylidene fluoride and a copolymer of polyvinylidene fluoride.

13. Sensor according to claim 1, wherein the porosity of the pyroelectric material is equal to more than 15% of the total surface area of the pyroelectric material.

14. Method of fabricating a thermal pattern sensor as defined in claim 1, comprising the following steps in sequence:
   a) supply a substrate, covered by a first electrode, and a layer of a porous pyroelectric material,
   b) deposit particles made of a first electrically insulating material with pyroelectric properties, on the layer of porous pyroelectric material so as to at least partially fill the pores of said layer,
   c) deposit a layer made of a second material on the layer of porous pyroelectric material, the second material being an electrically insulating material and having pyroelectric properties,
   d) form a second electrode.

15. Method according to claim 14, wherein between step b) and step d), and between step c) and step d), the method comprises an additional step in which a heat treatment is done at a temperature varying from 120° C. to 180° C.

16. Method according to claim 14, wherein step b) is done by depositing a solution containing ZnO particles and a solvent.

17. Method according to claim 14, wherein step b) is done by depositing a solution containing a solvent and particles into a mixture of stoichiometric or non-stoichiometric ZnO and $Zn(OH)_2$.

18. Method according to claim 17, wherein the solution contains 5mg/mL to 100mg/mL of particles.

19. Method according to claim 14, wherein the particles are obtained performing the following steps in sequence:

preparation and mixing of a solution comprising zinc acetate, KOH and a solvent in which ZnO and ZnO/Zn(OH)$_2$ are insoluble, heating of the solution to the solvent boiling temperature, under reflux, zinc acetate and KOH reacting to form ZnO/Zn(OH)$_2$ particles decantation of the solution obtained in the previous step, preferably, add a surfactant to disperse the particles.

20. Method according to claim 14, wherein the layer of porous pyroelectric material is deposited using a printing technique.

21. Sensor according to claim 1, wherein the particles have a largest dimension of from 20 nm to 100 nm.

22. Sensor according to claim 1, wherein the layer made of the second material is a layer of nanoparticles in contact with the second principle face of the pyroelectric layer, the nanoparticles at least partially filling the pores of the second principle face of the pyroelectric layer.

* * * * *